United States Patent
Xiao et al.

(10) Patent No.: US 11,749,687 B2
(45) Date of Patent: Sep. 5, 2023

(54) ARRAY SUBSTRATE, METHOD FOR FABRICATING SAME, AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventors: Bangqing Xiao, Guangdong (CN); Sen Xu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 536 days.

(21) Appl. No.: 17/052,579

(22) PCT Filed: Oct. 14, 2020

(86) PCT No.: PCT/CN2020/120825
§ 371 (c)(1),
(2) Date: Nov. 3, 2020

(87) PCT Pub. No.: WO2022/047896
PCT Pub. Date: Mar. 10, 2022

(65) Prior Publication Data
US 2023/0097478 A1    Mar. 30, 2023

(30) Foreign Application Priority Data
Sep. 1, 2020 (CN) .................... 202010906239.0

(51) Int. Cl.
*G02F 1/1333* (2006.01)
*H01L 27/12* (2006.01)
*G02F 1/1362* (2006.01)

(52) U.S. Cl.
CPC ...... *H01L 27/124* (2013.01); *G02F 1/136222* (2021.01); *G02F 1/136295* (2021.01); *H01L 27/1288* (2013.01)

(58) Field of Classification Search
CPC .................................................. G02F 1/1362
See application file for complete search history.

(56) References Cited

U.S. PATENT DOCUMENTS

| | | | |
|---|---|---|---|
| 2014/0168553 A1* | 6/2014 | Park ................... | G02F 1/1345 349/43 |
| 2018/0358422 A1* | 12/2018 | Han ................... | H01L 27/124 |
| 2019/0035874 A1* | 1/2019 | Han ................... | H10K 59/131 |

FOREIGN PATENT DOCUMENTS

| | | | | |
|---|---|---|---|---|
| CN | 102403320 | * | 4/2012 | ........ G02F 1/1333 |
| CN | 102403320 A | | 4/2012 | |

(Continued)

*Primary Examiner* — Sang V Nguyen
(74) *Attorney, Agent, or Firm* — SOROKER AGMON NORDMAN RIBA

(57) ABSTRACT

An array substrate, a method for fabricating the same, and a display panel are provided. The array substrate includes a first metal layer, a first insulating layer, a second metal layer, a second insulating layer, and a third metal layer. The first metal layer includes a first data line and a first vertical scan line. The second metal layer includes a horizontal scan line. The third metal layer includes a second data line and a second vertical scan line. The second data line is connected to the first data line through a first via hole. The second vertical scan line is connected to the first vertical scan line through a second via hole. The second vertical scan line is connected to the horizontal scan line through a third via hole. The first via hole, the second via hole, and the third via hole are formed by a same manufacturing process.

16 Claims, 16 Drawing Sheets

(56) References Cited

FOREIGN PATENT DOCUMENTS

| CN | 107195663 A | 9/2017 |
|---|---|---|
| CN | 107680976 A | 2/2018 |
| KR | 20150072509 A | 6/2015 |
| WO | 2017119338 A1 | 7/2017 |

* cited by examiner

| Providing a substrate, and forming a first metal layer on the substrate, wherein the first metal layer comprises a first data line and a first vertical scan line formed on the substrate. | S10 |

↓

| Forming a first insulating layer on the substrate and the first metal layer, wherein the first insulating layer covers the first metal layer; forming a second metal layer on the first insulating layer, wherein the second metal layer comprises a horizontal scan line formed on the first insulating layer; and forming a second insulating layer on the first insulating layer and the second metal layer, wherein the second insulating layer covers the second metal layer. | S20 |

↓

| Forming a first via hole and a second via hole penetrating the first insulating layer and the second insulating layer on the first metal layer, and forming a third via hole penetrating the second insulating layer, wherein the first via hole, the second via hole, and the third via hole are formed by a same manufacturing process. | S30 |

↓

| Forming a third metal layer on the second insulating layer, wherein the third metal layer comprises a second data line and a second vertical scan line form on the second insulating layer, the second data line is connected in parallel with the first data line through the first via hole, the second vertical scan line is connected in parallel with the first vertical scan line through the second via hole, and the second vertical scan line is connected to the horizontal scan line through the third via hole. | S40 |

↓

| Forming a protective passivation layer on the second insulating layer, the third metal layer, and the active layer, wherein the protective passivation layer covers the third metal layer and the active layer; forming a color resist layer on the protective passivation layer; forming an insulating flat layer on the color resist layer; forming a fourth via hole penetrating the protective passivation layer, the color resist layer, and the insulating flat layer on the drain electrode; and forming a pixel electrode layer on the insulating flat layer, wherein the pixel electrode layer is connected to the drain electrode through the fourth via hole. | S50 |

FIG. 7

ARRAY SUBSTRATE, METHOD FOR FABRICATING SAME, AND DISPLAY PANEL

FIELD OF INVENTION

The present disclosure relates to the technical field of display, and particularly to an array substrate, a method for fabricating the same, and a display panel.

BACKGROUND

With the development of display technology, narrow frame display panels have become a focus in the industry. Ultra-narrow frame display panels can realize seamless splicing of the display panels. A current ultra-narrow frame is mainly realized by a structure of gate driver on array (GOA). That is, scan lines with signal output function are disposed on a same chip on film (COF) as data lines, thereby reducing widths of three sides of a frame of a display panel and achieving a display effect "three narrow and one wide". In this structure, a density of traces such as the scan lines and the data lines increase. In order not to affect a pixel aperture ratio, the scan lines and data lines are designed to be narrow. This increases resistance and capacitance of the traces such as the scan lines and the data lines, which is prone to signal transmission delay (RC loading) and insufficient pixel charging.

Currently, in order to solve the above problems, a layer of metal traces is generally added in an array substrate and is connected in parallel with original data lines and scan lines to reduce resistance. Specifically, as shown in FIG. 1, an array substrate comprises a substrate 11, a first metal layer 12, a first insulating layer 13, a second metal layer 14, a second insulating layer 15, and a third metal layer 16 that are stacked in sequence. The first metal layer 12 comprises a horizontal scan line 121. The second metal layer 14 comprises a first vertical scan line 141 and a first data line 142. The third metal layer 16 is a newly added metal layer connected in parallel with the first vertical scan line 141 and the first data line 142 to reduce resistance. The third metal layer 16 comprises a third scan line 161 connected in parallel with the first scan line 141, and a second data line 162 connected in parallel with the first data line 142. Obviously, it is necessary to separately form a first via hole 131 penetrating the first insulating layer 13 and a second via hole 151 penetrating the second insulating layer 15 to realize a connection between the aforementioned metal layers. This structure not only increases complexity of the array substrate, but also increases manufacturing processes of forming the third metal layer 16 and forming the second via hole 151 penetrating the second insulating layer 15, thereby increasing production costs and production time.

SUMMARY OF DISCLOSURE

The present disclosure provides an array substrate, a method for fabricating the same, and a display panel to solve the technical problem of increased production costs and production time due to increased number of processes after a layer of metal traces are added in an ultra-narrow frame display panel and is connected in parallel with original data lines and scan lines to reduce resistance.

In order to solve the above problems, the present disclosure provides the following solutions.

The present disclosure provides an array substrate comprising:
 a substrate;
 a first metal layer disposed on the substrate and comprising a first data line and a first vertical scan line;
 a first insulating layer disposed on the substrate and the first metal layer and covering the first metal layer;
 a second metal layer disposed on the first insulating layer and comprising a horizontal scan line;
 a second insulating layer disposed on the first insulating layer and the second metal layer and covering the second metal layer;
 a first via hole and a second via hole penetrating the first insulating layer and the second insulating layer on the first metal layer;
 a third via hole penetrating the second insulating layer; and
 a third metal layer disposed on the second insulating layer and comprising a second data line and a second vertical scan line, wherein the second data line is connected in parallel with the first data line through the first via hole, the second vertical scan line is connected in parallel with the first vertical scan line through the second via hole, and the second vertical scan line is connected to the horizontal scan line through the third via hole;
 wherein the first via hole, the second via hole, and the third via hole are formed by a same manufacturing process.

In an embodiment, the array substrate further comprises a plurality of sub-pixel regions. The first via hole and the second via hole are located between the sub-pixel regions. The third via hole is located in one of the sub-pixel regions.

In an embodiment, the second metal layer further comprises a common electrode, and a gate electrode connected to the horizontal scan line.

In an embodiment, the array substrate further comprises an active layer disposed on the second insulating layer and corresponding to the gate electrode. The third metal layer further comprises a source electrode and a drain electrode disposed on the active layer.

In an embodiment, the array substrate further comprises:
 a protective passivation layer disposed on the second insulating layer, the third metal layer, and the active layer and covering the third metal layer and the active layer;
 a color resist layer disposed on the protective passivation layer;
 an insulating flat layer disposed on the color resist layer;
 a fourth via hole penetrating the protective passivation layer, the color resist layer, and the insulating flat layer on the drain electrode; and
 a pixel electrode layer disposed on the insulating flat layer and connected to the drain electrode through the fourth via hole.

The present disclosure further provides a method for fabricating an array substrate. The method comprises:
 providing a substrate;
 forming a first metal layer on the substrate, wherein the first metal layer comprises a first data line and a first vertical scan line formed on the substrate;
 forming a first insulating layer on the substrate and the first metal layer, wherein the first insulating layer covers the first metal layer;
 forming a second metal layer on the first insulating layer, wherein the second metal layer comprises a horizontal scan line formed on the first insulating layer;
 forming a second insulating layer on the first insulating layer and the second metal layer, wherein the second insulating layer covers the second metal layer;

forming a first via hole and a second via hole penetrating the first insulating layer and the second insulating layer on the first metal layer;

forming a third via hole penetrating the second insulating layer, wherein the first via hole, the second via hole, and the third via hole are formed by a same manufacturing process; and forming a third metal layer on the second insulating layer, wherein the third metal layer comprises a second data line and a second vertical scan line formed on the second insulating layer, the second data line is connected in parallel with the first data line through the first via hole, the second vertical scan line is connected in parallel with the first vertical scan line through the second via hole, and the second vertical scan line is connected to the horizontal scan line through the third via hole.

In an embodiment, the first via hole, the second via hole, and the third via hole are formed by a gray-scale mask.

In an embodiment, the array substrate comprises a plurality of sub-pixel regions. The first via hole and the second via hole are formed between the sub-pixel regions. The third via hole is formed in one of the sub-pixel regions.

In an embodiment, the second metal layer further comprises a common electrode and a gate electrode formed on the first insulating layer, and the gate electrode is connected to the horizontal scan line.

In an embodiment, before the step of forming the first via hole and the second via hole penetrating the first insulating layer and the second insulating layer on the first metal layer and the step of forming the third via hole penetrating the second insulating layer, the method further comprises: forming an active layer on the second insulating layer. The active layer corresponds to the gate electrode. The third metal layer further comprises a source electrode and a drain electrode formed on the active layer.

In an embodiment, the method further comprises:

forming a protective passivation layer on the second insulating layer, the third metal layer, and the active layer, wherein the protective passivation layer covers the third metal layer and the active layer;

forming a color resist layer on the protective passivation layer;

forming an insulating flat layer on the color resist layer;

forming a fourth via hole penetrating the protective passivation layer, the color resist layer, and the insulating flat layer on the drain electrode; and forming a pixel electrode layer on the insulating flat layer, wherein the pixel electrode layer is connected to the drain electrode through the fourth via hole.

The present disclosure further provides a display panel. The display panel comprises a color filter substrate, the array substrate as described in the previous embodiments, and a liquid crystal layer disposed between the color filter substrate and the array substrate.

In the present disclosure, the first metal layer comprises the first data line and the first vertical scan line, the second metal layer comprises the horizontal scan line, and the third metal layer comprises the second data line and the second vertical scan line. Therefore, the first via hole required for parallel connection of the second data line and the first data line, the second via hole required for parallel connection of the second vertical scan line and the first vertical scan line, and the third via hole required for parallel connection of the second vertical scan line and the horizontal scan line can be formed by a same manufacturing process. This ensures that resistance of the first data line and the first vertical scan line is reduced by adding the third metal layer, steps for fabricating the array substrate are reduced, and the production costs and production time of the display panel are reduced overall.

BRIEF DESCRIPTION OF DRAWINGS

In order to more clearly illustrate technical solutions in embodiments or the prior art, a brief description of accompanying drawings used in a description of the embodiments or the prior art will be given below. Obviously, the accompanying drawings in the following description are merely some embodiments of the present invention. For those skilled in the art, other drawings may be obtained from these accompanying drawings without creative labor.

FIG. 7 is a structural block flowchart of a second method for fabricating an array substrate according to an embodiment of the present disclosure.

DETAILED DESCRIPTION

Figure 1:
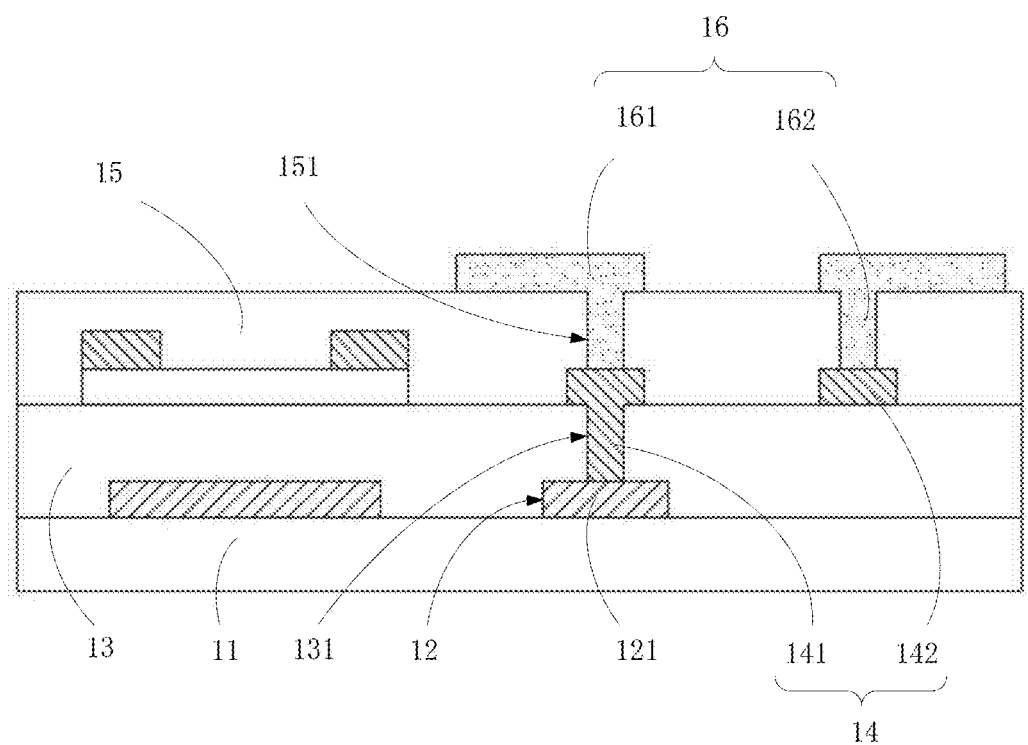
FIG. 1 is a schematic structural diagram of an array substrate in the prior art.

The following description of various embodiments of the present disclosure with reference to the accompanying drawings is used to illustrate specific embodiments that can be practiced. Directional terms mentioned in the present disclosure, such as "above", "below", "front", "back", "left", "right", "inside", "outside", "side", are merely used to indicate the direction of the accompanying drawings. Therefore, the directional terms are used for illustrating and understanding the present disclosure rather than limiting the present disclosure. In the drawings, elements with similar structures are indicated by the same reference numerals.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "within", "outside", "clockwise", and "counterclockwise" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

In the present disclosure, it should be noted that, unless otherwise explicitly specified or defined, the terms such as "mount", "connect", and "connection" should be interpreted in a broad sense. For example, a connection may be a fixed connection, a detachable connection, or an integral connection. A connection may be a mechanical connection, an electrical connection, or a mutual communication. A connection may be a direct connection or may be an indirect connection by using an intermediate medium. A connection may be an internal connection or an interaction between two elements. It may be appreciated by those of ordinary skill in the art that the specific meanings of the aforementioned terms in the present disclosure can be understood depending on specific situations.

In the present disclosure, unless otherwise specifically specified or limited, a structure in which a first feature is "on" or "under" a second feature may comprise an embodiment in which the first feature directly contacts the second feature, and may also comprise an embodiment in which the first feature and the second feature are not in direct contact with each other, but are contacted via an additional feature formed therebetween. Furthermore, a structure in which a first feature is "on", "above", or "on top of" a second feature may comprise an embodiment in which the first feature is right or obliquely "on", "above", or "on top of" the second feature, or just means that a sea-level elevation of the first feature is greater than a sea-level elevation of the second feature. A structure in which a first feature "under", "below", or "on bottom of" a second feature may include an embodiment in which the first feature is right "beneath," "below," or "on bottom of" the second feature, and may also comprises an embodiment in which the first feature is right or obliquely "under", "below", or "on bottom of" the second feature, or just means that a sea-level elevation of the first feature is less than a sea-level elevation of the second feature.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Figure 2:
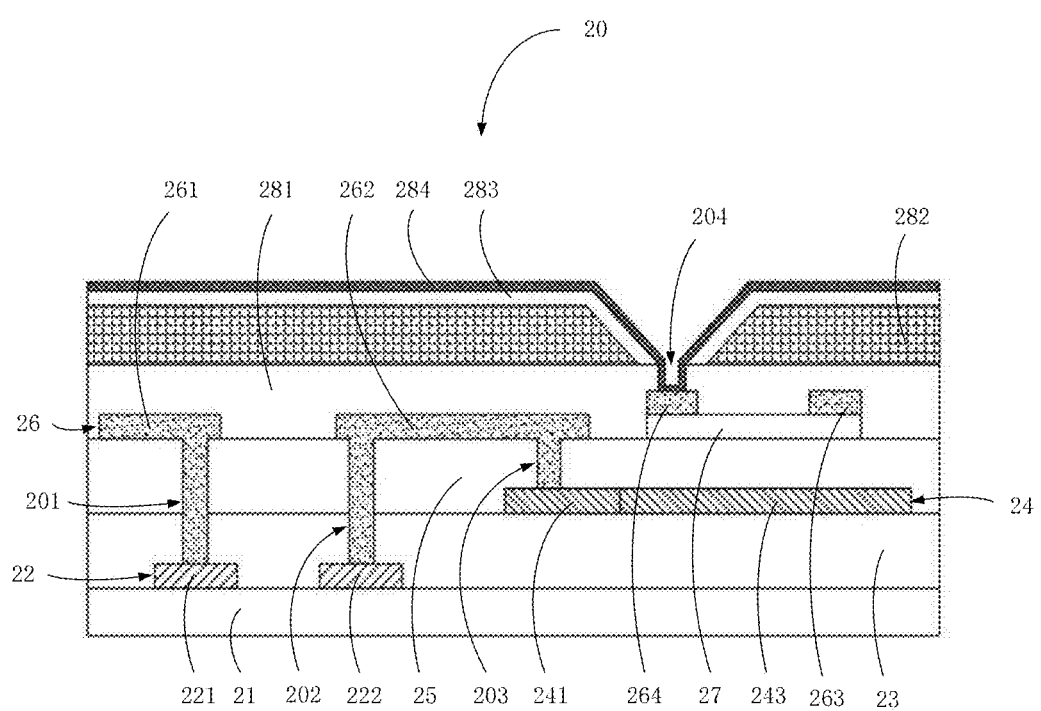
FIG. 2 is a schematic structural diagram of an array substrate according to an embodiment of the present disclosure.
Figure 3:
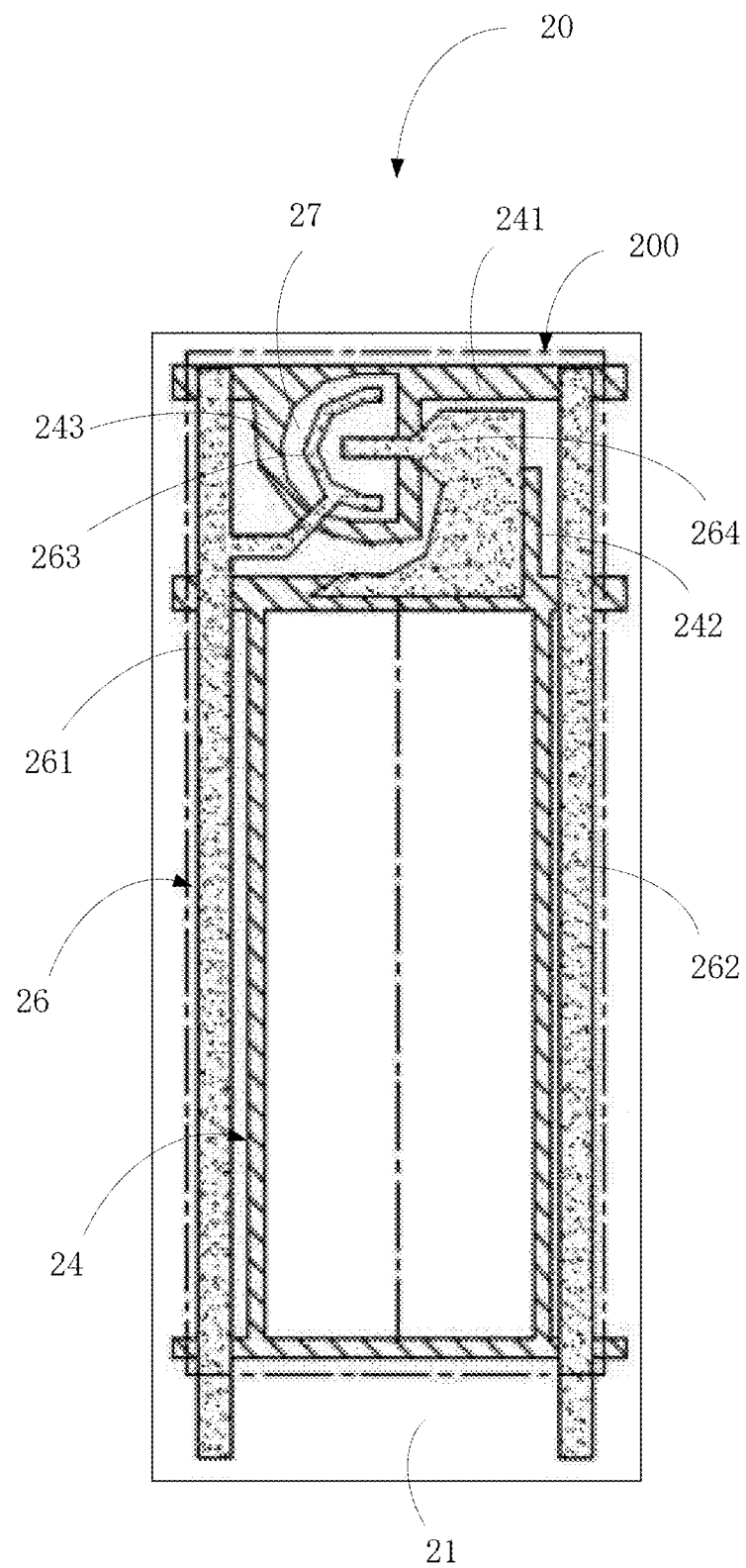
FIG. 3 is a top view of the array substrate according to an embodiment of the present disclosure.

Please refer to FIG. 2 and FIG. 3, the present disclosure provides an array substrate 20 comprising a substrate 21, a first metal layer 22 disposed on the substrate 21, a first insulating layer 23 disposed on the substrate 21 and the first metal layer 22 and covering the first metal layer 22, a second metal layer 24 disposed on the first insulating layer 23, a second insulating layer 25 disposed on the first insulating layer 23 and the second metal layer 24 and covering the second metal layer 24, and a third metal layer 26 disposed on the second insulating layer 25.

The first metal layer 22 comprises a first data line 221 and a first vertical scan line 222. The second metal layer 24 comprises a horizontal scan line 241. The third metal layer 26 comprises a second data line 261 and a second vertical scan line 262. The array substrate 20 further comprises a first via hole 201 and a second via hole 202 penetrating the first insulating layer 23 and the second insulating layer 25 on the first metal layer 22, and a third via hole 203 penetrating the second insulating layer 25. The second data line 261 is connected in parallel with the first data line 221 through the first via hole 201. The second vertical scan line 262 is connected in parallel with the first vertical scan line 222 through the second via hole 202. The second vertical scan line 262 is connected to the horizontal scan line 241 through the third via hole 203. The first via hole 201, the second via hole 202, and the third via hole 203 are formed by a same manufacturing process.

Understandably, currently, in order to solve the problems of signal transmission delay (RC loading) and insufficient pixel charging caused by an increase of resistance and capacitance of traces such as the scan lines and data lines due to a narrow design of the traces such as the scan lines and the data lines in a narrow frame display panel, a layer of metal traces is generally added in an array substrate and is connected in parallel with original data lines and scan lines to reduce resistance. Specifically, as shown in FIG. 1, an array substrate comprises a substrate 11, a first metal layer 12, a first insulating layer 13, a second metal layer 14, a second insulating layer 15, and a third metal layer 16 that are stacked in sequence. The first metal layer 12 comprises a horizontal scan line 121. The second metal layer 14 comprises a first vertical scan line 141 and a first data line 142. The third metal layer 16 is a newly added metal layer connected in parallel with the first vertical scan line 141 and the first data line 142 to reduce resistance. The third metal layer 16 comprises a third scan line 161 connected in parallel with the first scan line 141, and a second data line 162 connected in parallel with the first data line 142. Obviously, it is necessary to separately form a first via hole 131 penetrating the first insulating layer 13 and a second via hole 151 penetrating the second insulating layer 15 to realize a connection between the aforementioned metal layers. This structure not only increases complexity of the array substrate, but also increases manufacturing processes of forming the third metal layer 16 and forming the second via hole 151 penetrating the second insulating layer 15, thereby increasing production costs and production time. In this embodiment, the first metal layer 22 comprises the first data line 221 and the first vertical scan line 222, the second metal layer 24 comprises the horizontal scan line 241, and the third metal layer 26 comprises the second data line 261 and the second vertical scan line 262. Therefore, the first via hole 201 required for parallel connection of the second data line 261 and the first data line 221, the second via hole 202 required for parallel connection of the second vertical scan line 262 and the first vertical scan line 222, and the third via hole 203 required for parallel connection of the second vertical scan line 262 and the horizontal scan line 241 can be formed by the same manufacturing process. This ensures that resistance of the first data line 221 and the first vertical scan line 222 is reduced by adding the third metal layer 26, steps for fabricating the array substrate 20 are reduced, and the production costs and production time of the display panel are reduced overall.

Please note that, as shown in FIG. 3, an orthographic projection of the second data line 261 on the substrate 21 may coincide with an orthographic projection of the first data line 221 on the substrate 21, and an orthographic projection of the second vertical scan line 262 on the substrate 21 may coincide with an orthographic projection of the first vertical scan line 222 on the substrate 21. In order to achieve a better effect of reducing resistance by parallel connection, thickness and/or width of the second data line 261 may be greater than that of the first data line 221, and thickness and/or width of the second vertical scan line 262 may be greater than that of the first vertical scan line 222.

Figure 5A:
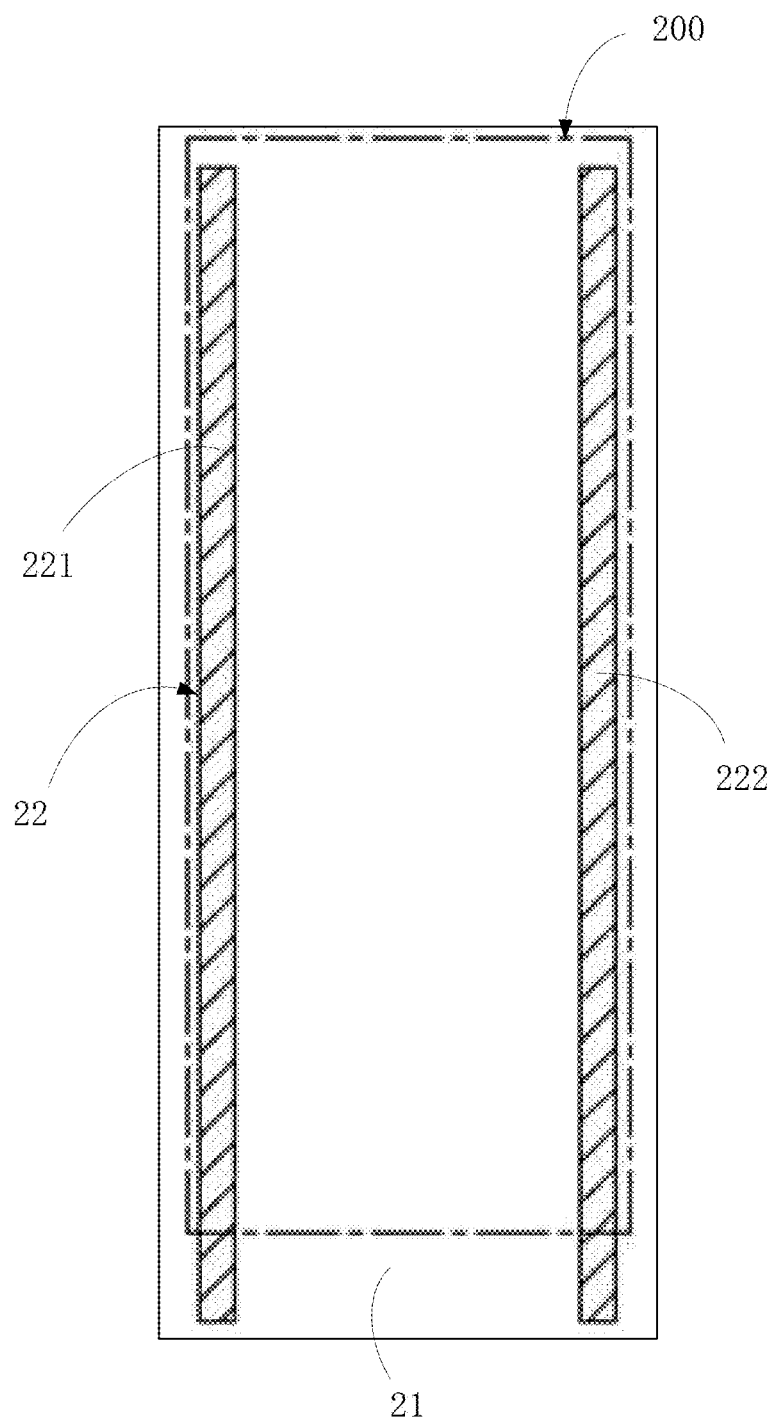
FIG. 5A to FIG. 5E are top-view structural flowcharts of the method for fabricating the array substrate according to an embodiment of the present disclosure.
Figure 5B:
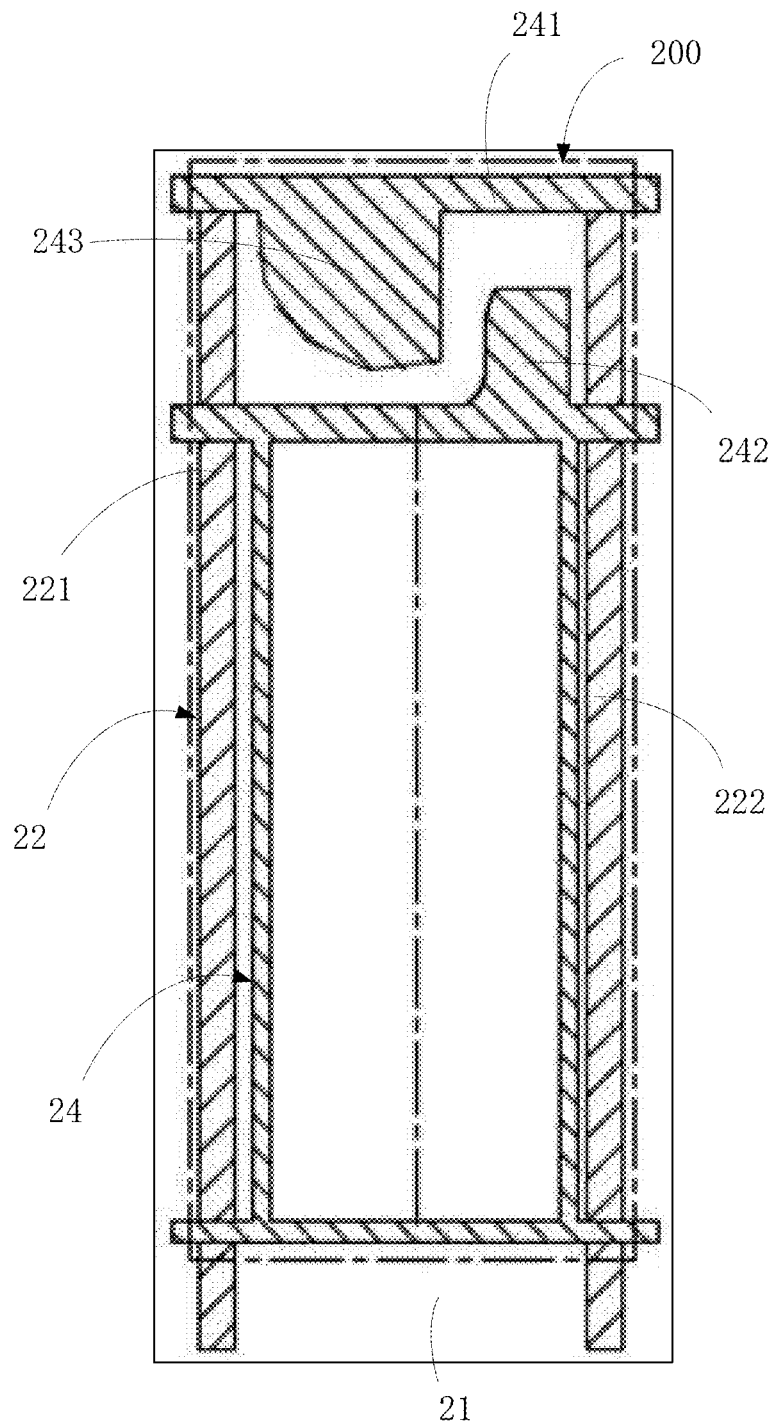
Figure 5C:
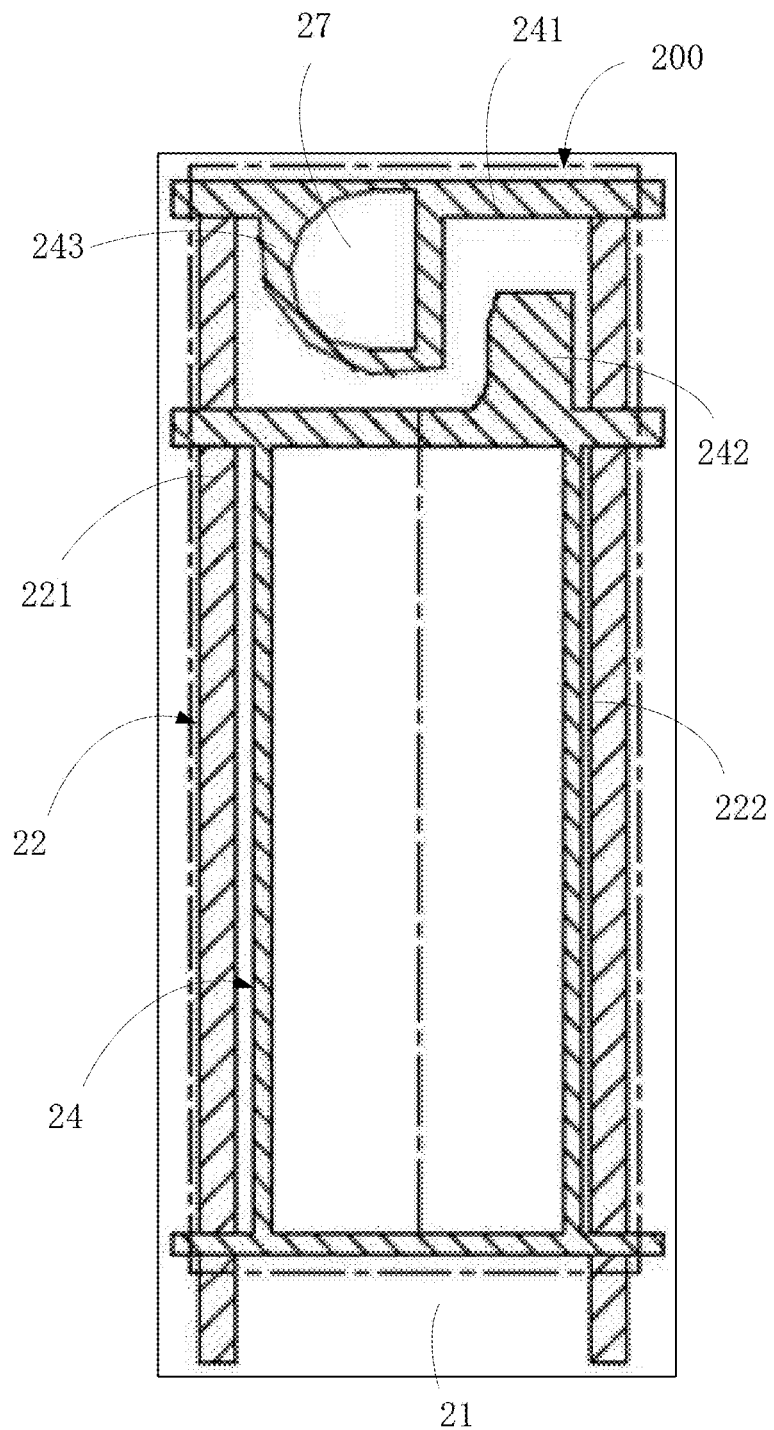
Figure 5D:
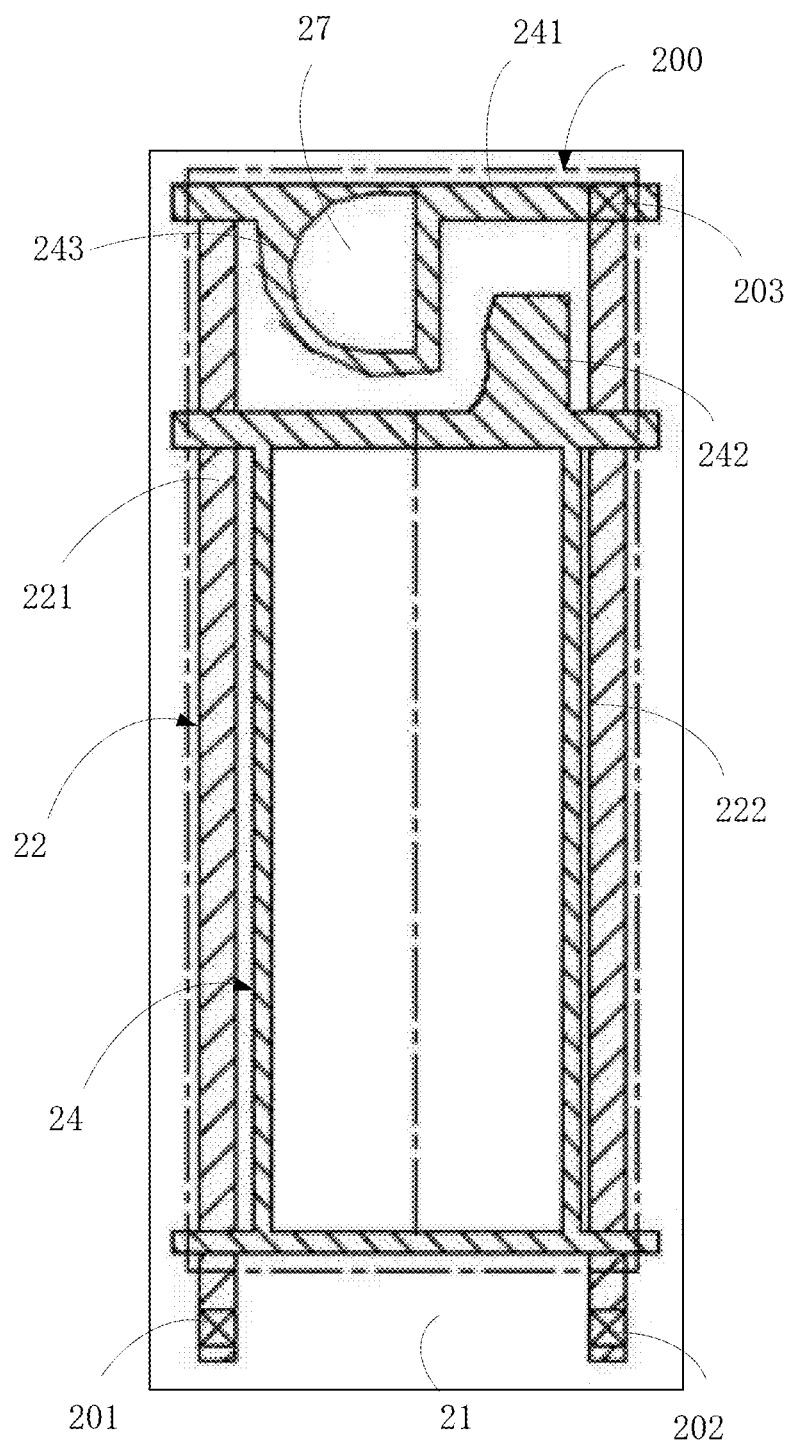

In an embodiment, as shown in FIG. 5D, the array substrate 20 further comprises a plurality of sub-pixel regions 200. The first via hole 201 and the second via hole 202 are located between the sub-pixel regions 200. The third via hole 203 is located in one of the sub-pixel regions 200. Understandably, the first via hole 201 and the second via hole 202 are located between the sub-pixel regions 200, that is, the first via hole 201 and the second via hole 202 are located in an opaque non-active display area. Specifically, the first via hole 201 and the second via hole 202 are located in an area covered by, for example, a black matrix, which does not affect an overall transmittance of the array substrate 20. In addition, the first via hole 201 and the second via hole 202 are respectively used for parallel connection of the second data line 261 and the first data line 221 in the non-active display area, and parallel connection of the second vertical scan line 262 and the first vertical scan line 222 in the non-active display area. In order to reduce an influence on the transmittance of the array substrate 20, in this embodiment, the first via hole 201 and the second via hole 202 are located between the sub-pixel regions 200. This also prevents functional structures in the sub-pixel regions 200 from being too dense and makes an overall layout more reasonable.

In an embodiment, as shown in FIG. 5B to FIG. 5E, the second metal layer 24 further comprises a common electrode 242, and a gate electrode 243 connected to the horizontal scan line 241. Understandably, in this embodiment, the gate electrode 243 and the horizontal scan line 241 are disposed on a same layer and between the first insulating layer 23 and the second insulating layer 25. When the gate electrode 243 and the horizontal scan line 241 are disposed in different layers and connected, this prevents a need for additional via holes, thereby preventing an increase in the steps for fabricating the array substrate 20.

In an embodiment, as shown in FIG. 2 and FIG. 3, the array substrate 20 further comprises an active layer 27 disposed on the second insulating layer 25 and corresponding to the gate electrode 243. The third metal layer 26 further comprises a source electrode 263 and a drain electrode 264 disposed on the active layer 27. Understandably, in this embodiment, the active layer 27 is disposed on the second insulating layer 25, and the third metal layer 26 further comprises the source electrode 263 and the drain electrode 264 disposed on the active layer 27, so that the source electrode 263, the drain electrode 264, and the gate electrode 243 in the array substrate 20 are disposed further away from the substrate 21. This prevents the first insulating layer 23 from having to be provided with via holes before the second insulating layer 25 is made, thereby reducing complexity of fabrication.

In an embodiment, as shown in FIG. 2, the array substrate 20 further comprises: a protective passivation layer 281 disposed on the second insulating layer 25, the third metal layer 26, and the active layer 27 and covering the third metal layer 26 and the active layer 27; a color resist layer 282 disposed on the protective passivation layer 281; an insulating flat layer 283 disposed on the color resist layer 282; a fourth via hole 204 penetrating the protective passivation layer 281, the color resist layer 282, and the insulating flat layer 283 on the drain electrode 264; and a pixel electrode layer 284 disposed on the insulating flat layer 283 and connected to the drain electrode 264 through the fourth via hole 204. Understandably, in this embodiment, the insulating flat layer 283 is made of an organic insulating material, and is a polymer film on array (PFA). Specifically, the active layer 27 is disposed on the second insulating layer 25, and the third metal layer 26 further comprises the source electrode 263 and the drain electrode 264 disposed on the active layer 27, so that the source electrode 263 and the drain electrode 264 in the array substrate 20 are closer to the pixel electrode layer 284. This reduces a number of the layers penetrated by the fourth via hole 204, thereby reducing a depth of the fourth via hole 204, and facilitating reduction of manufacturing time and difficulty.

Figure 6:
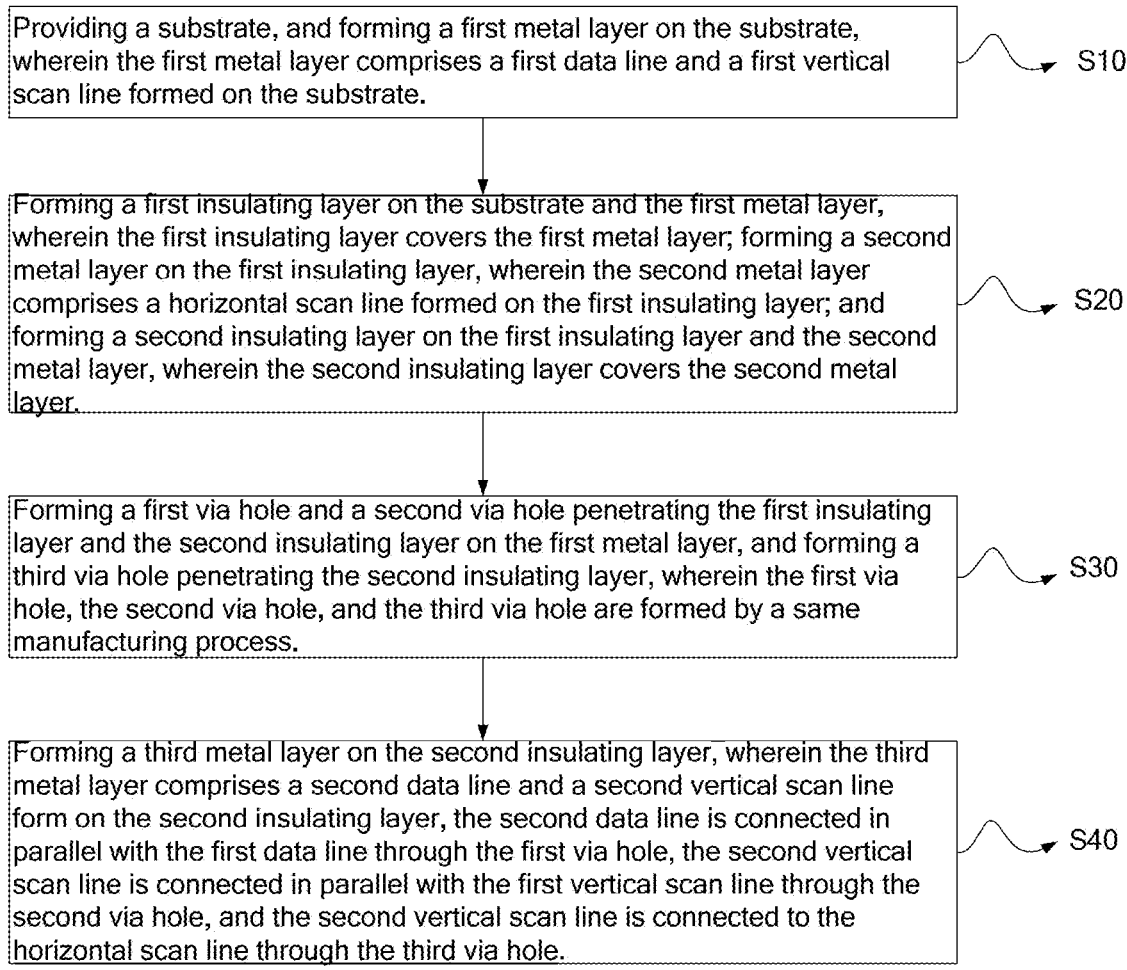
FIG. 6 is a structural block flowchart of a first method for fabricating an array substrate according to an embodiment of the present disclosure.

The present disclosure further provides a method for fabricating an array substrate 20. As shown in FIG. 6, the method comprises the following steps.

Figure 4A:
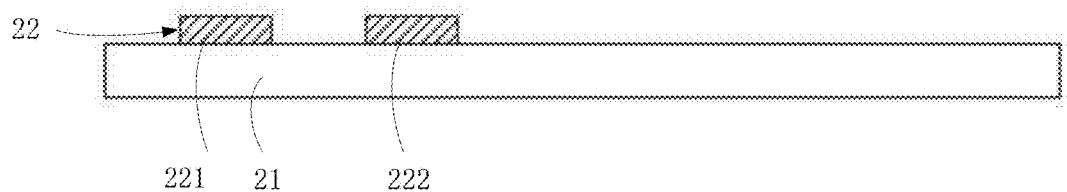
FIG. 4A to FIG. 4K are structural flowcharts of a method for fabricating an array substrate according to an embodiment of the present disclosure.
Figure 4B:
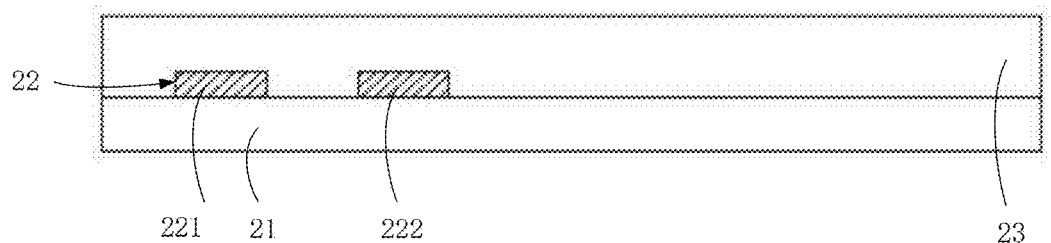
Figure 4C:
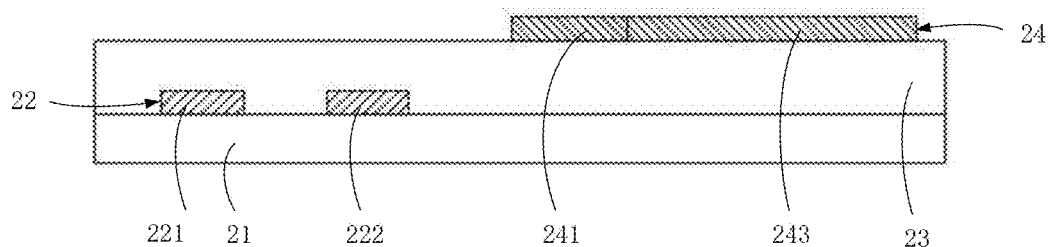
Figure 4D:
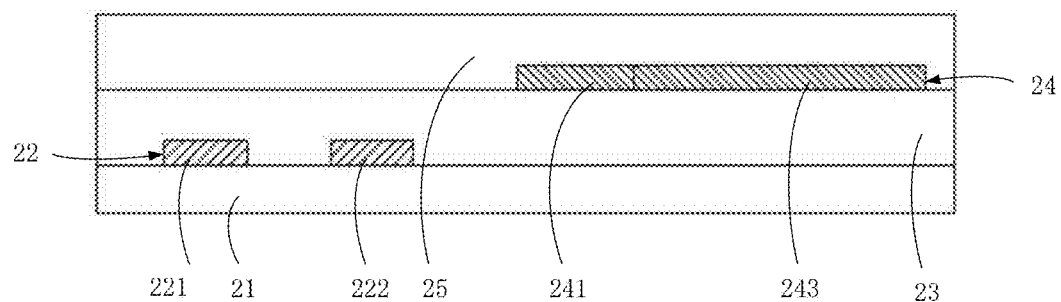
Figure 4E:
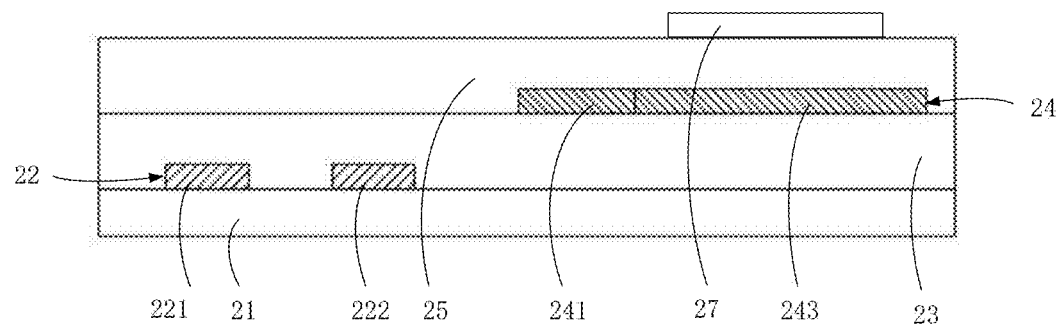
Figure 4F:
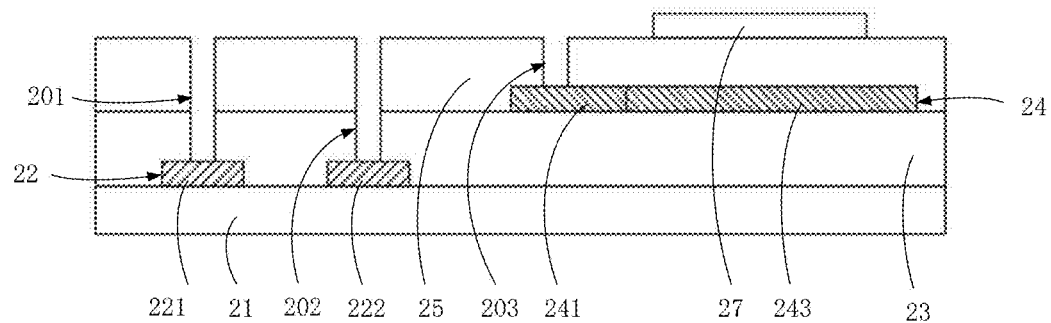

Step S10: as shown in FIG. 4A and FIG. 5A, providing a substrate 21, and forming a first metal layer 22 on the substrate 21, wherein the first metal layer 22 comprises a first data line 221 and a first vertical scan line 222 formed on the substrate 21.

Step S20: as shown in FIG. 4B to FIG. 4D and FIG. 5B, forming a first insulating layer 23 on the substrate 21 and the first metal layer 22, wherein the first insulating layer 23 covers the first metal layer 22; forming a second metal layer 24 on the first insulating layer 23, wherein the second metal layer 24 comprises a horizontal scan line 241 formed on the first insulating layer 23; and forming a second insulating layer 25 on the first insulating layer 23 and the second metal layer 24, wherein the second insulating layer 25 covers the second metal layer 24.

Step S30: as shown in FIG. 4E, FIG. 4F, FIG. 5C, and FIG. 5D, forming a first via hole 201 and a second via hole 202 penetrating the first insulating layer 23 and the second insulating layer 25 on the first metal layer 22, and forming a third via hole 203 penetrating the second insulating layer 25, wherein the first via hole 201, the second via hole 202, and the third via hole 203 are formed by a same manufacturing process.

Figure 4G:
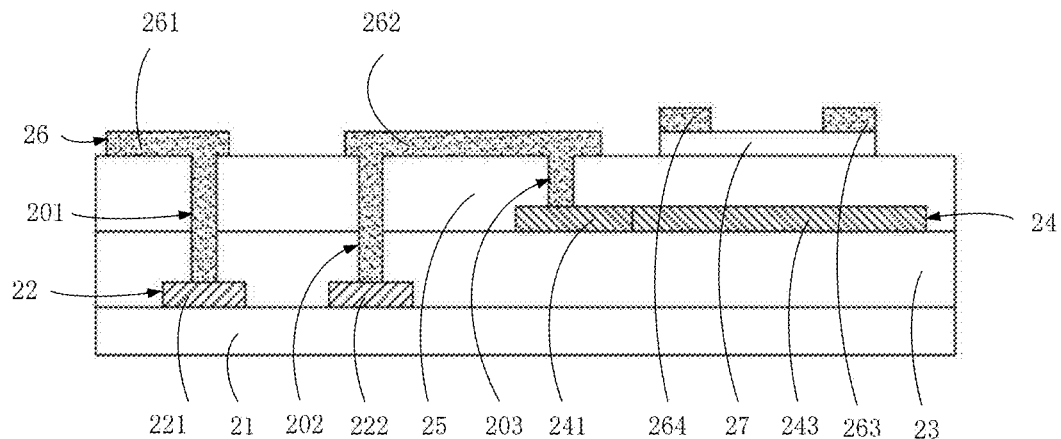
Figure 4H:
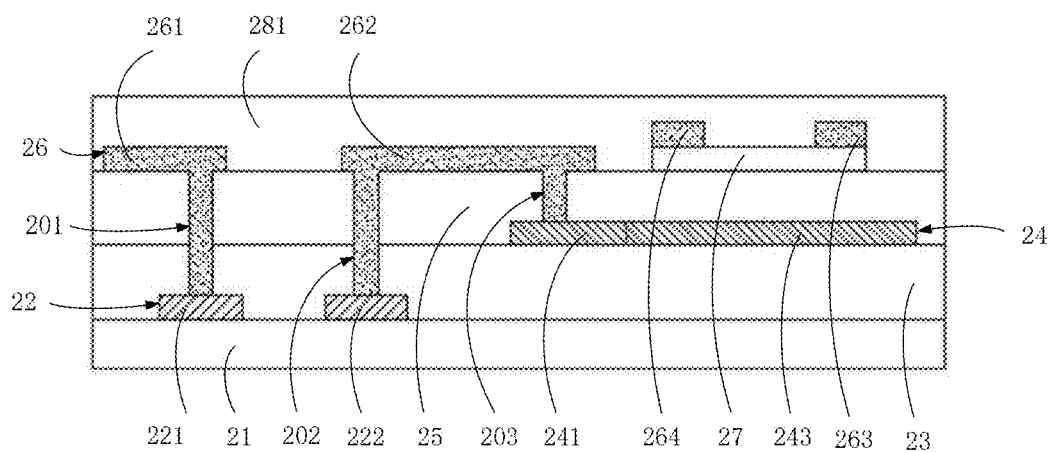
Figure 4I:
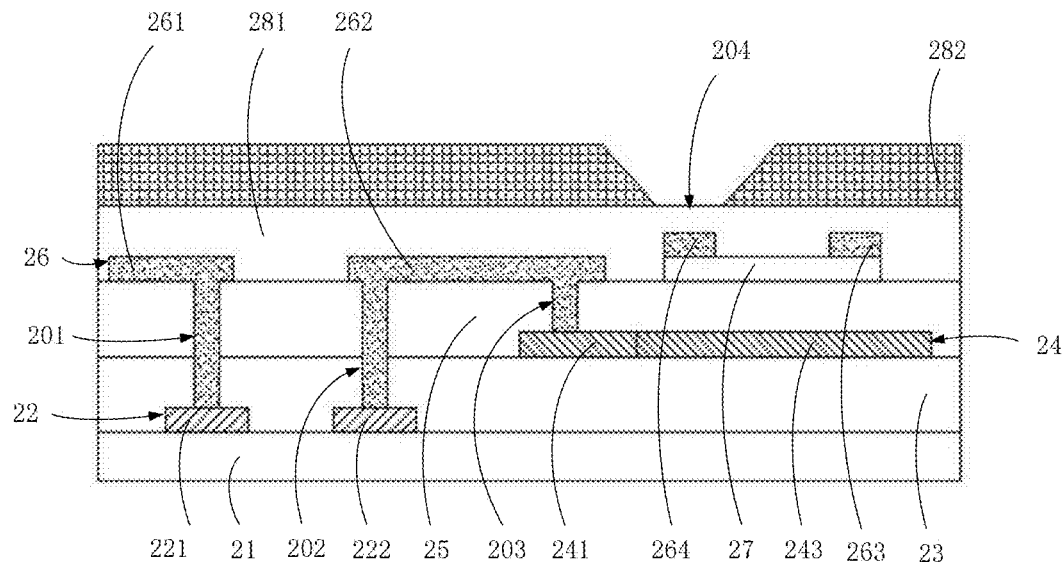
Figure 4J:
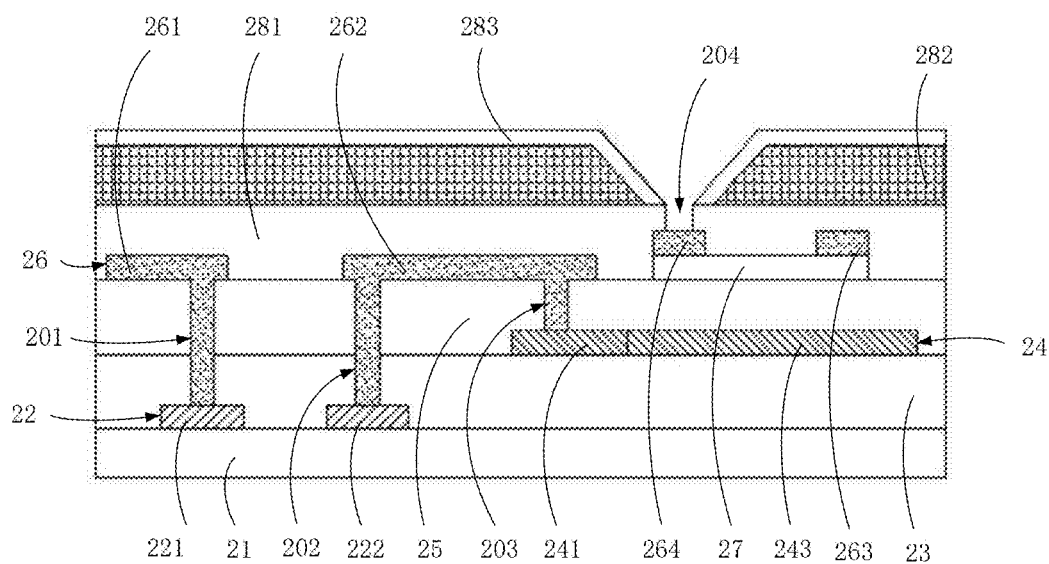
Figure 4K:
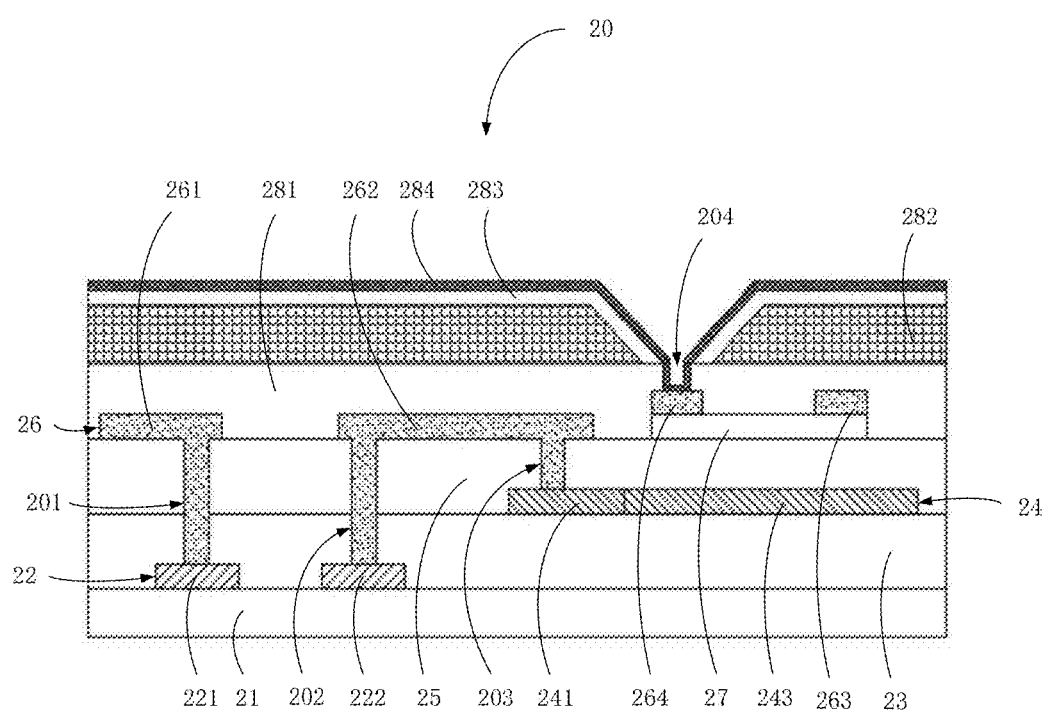
Figure 5E:
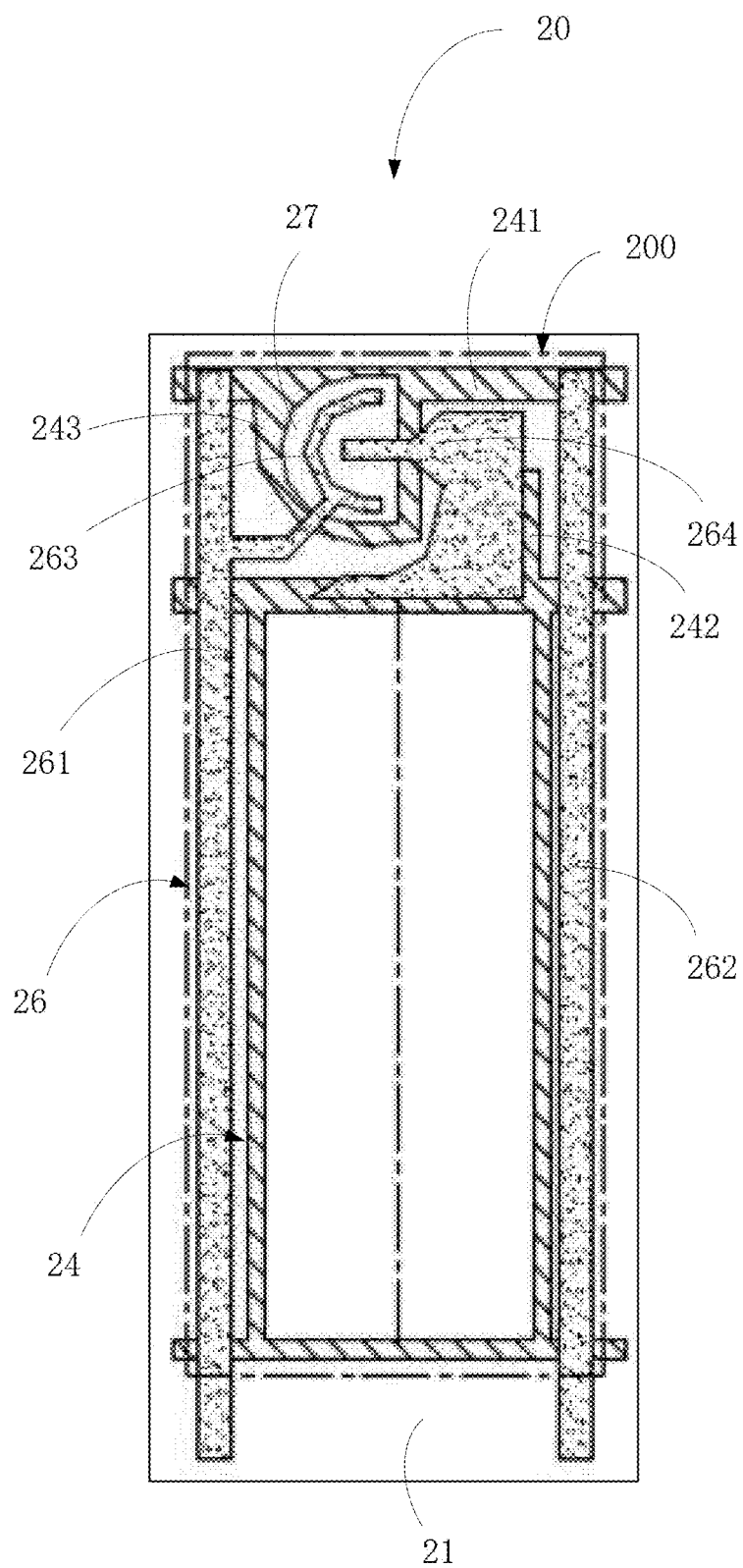

Step S40: as shown in FIG. 4G and FIG. 5E, forming a third metal layer 26 on the second insulating layer 25, wherein the third metal layer 26 comprises a second data line 261 and a second vertical scan line 262 formed on the second insulating layer 25, the second data line 261 is connected in parallel with the first data line 221 through the first via hole 201, the second vertical scan line 262 is connected in parallel with the first vertical scan line 222 through the second via hole 202, and the second vertical scan line 262 is connected to the horizontal scan line 241 through the third via hole 203.

Understandably, the substrate 21 may be a glass substrate. The first data line 221 and the first vertical scan line 222 of the first metal layer 22 are made by a same manufacturing process. The second data line 261 and the second vertical scan line 262 of the third metal layer 26 are made by a same manufacturing process. In the method, the first metal layer 22 comprising the first data line 221 and the first vertical scan line 222 is first formed on the substrate 21. The first insulating layer 23 covering the first metal layer 22 is formed on the substrate 21 and the first metal layer 22. Then, the second metal layer 24 comprising the horizontal scan line 241 is formed on the first insulating layer 23. The second insulating layer 25 covering the second metal layer 24 is formed on the first insulating layer 23 and the second metal layer 24. Finally, the third metal layer 26 comprising the second data line 261 and the second vertical scan line 262 is formed on the second insulating layer 25. Therefore, the first via hole 201 required for parallel connection of the second data line 261 and the first data line 221, the second via hole 202 required for parallel connection of the second vertical scan line 262 and the first vertical scan line 222, and the third via hole 203 required for parallel connection of the second vertical scan line 262 and the horizontal scan line 241 can be formed by a same manufacturing process. This ensures that resistance of the first data line 221 and the first vertical scan line 222 is reduced by adding the third metal layer 26, steps for fabricating the array substrate 20 are reduced, and the production costs and production times of the display panel are reduced overall. In this embodiment, the first via hole 201, the second via hole 202, and the third via hole 203 are formed by a gray-scale mask.

In an embodiment, as shown in FIG. 5B to FIG. 5D and FIG. 2, the second metal layer 24 further comprises a common electrode 242 and a gate electrode 243 formed on the first insulating layer 23, and the gate electrode 243 is connected to the horizontal scan line 241. Understandably, the common electrode 242, the gate electrode 243, and the horizontal scan line 241 are disposed on a same layer, and are formed by a same manufacturing process.

In an embodiment, as shown in FIG. 4D to FIG. 4F and FIG. 5C, before the step of forming the first via hole 201 and the second via hole 202 penetrating the first insulating layer 23 and the second insulating layer 25 on the first metal layer 22, and the step of forming the third via hole 203 penetrating the second insulating layer 25, the method further comprises: forming an active layer 27 on the second insulating layer 25, wherein the active layer 27 corresponds to the gate electrode 243. The third metal layer 26 further comprises a source electrode 263 and a drain electrode 264 formed on the active layer 27.

In an embodiment, as shown in FIG. 7, the method for fabricating the array substrate 20 further comprises step S50. Step S50: as shown in FIG. 4H to FIG. 4K, forming a protective passivation layer 281 on the second insulating layer 25, the third metal layer 26, and the active layer 27, wherein the protective passivation layer 281 covers the third metal layer 26 and the active layer 27; forming a color resist layer 282 on the protective passivation layer 281; forming an insulating flat layer 283 on the color resist layer 282; forming a fourth via hole 204 penetrating the protective passivation layer 281, the color resist layer 282, and the insulating flat layer 283 on the drain electrode 264; and forming a pixel electrode layer 284 on the insulating flat layer 283, wherein the pixel electrode layer 284 is connected to the drain electrode 264 through the fourth via hole 204.

Figure 8:
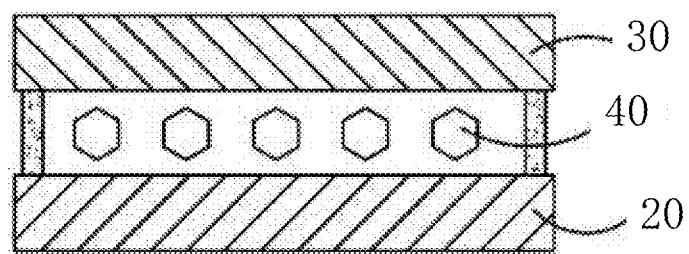
FIG. 8 is a schematic structural diagram of a display panel according to an embodiment of the present disclosure.

The present disclosure further provides a display panel. As shown in FIG. 8, the display panel comprises a color filter substrate 30, the array substrate 20 as described in the previous embodiments, and a liquid crystal layer 40 disposed between the color filter substrate 30 and the array substrate 20.

In the above, in the present disclosure, the first metal layer 22 comprises the first data line 221 and the first vertical scan line 222, the second metal layer 24 comprises the horizontal scan line 241, and the third metal layer 26 comprises the second data line 261 and the second vertical scan line 262. Therefore, the first via hole 201 required for parallel connection of the second data line 261 and the first data line 221, the second via hole 202 required for parallel connection of the second vertical scan line 262 and the first vertical scan line 222, and the third via hole 203 required for parallel connection of the second vertical scan line 262 and the horizontal scan line 241 can be formed by a same manufacturing process. This ensures that resistance of the first data line 221 and the first vertical scan line 222 is reduced by adding the third metal layer 26, steps for fabricating the array substrate 20 are reduced, and the production costs and production time of the display panel are reduced overall.

The present invention has been described in the above preferred embodiments, but the preferred embodiments are not intended to limit the present invention. Those skilled in the art may make various changes and modifications without departing from the scope of the present invention. The scope of the present invention is determined by claims.

What is claimed is:

1. An array substrate, comprising:
    a substrate;
    a first metal layer disposed on the substrate and comprising a first data line and a first vertical scan line;
    a first insulating layer disposed on the substrate and the first metal layer and covering the first metal layer;
    a second metal layer disposed on the first insulating layer and comprising a horizontal scan line;
    a second insulating layer disposed on the first insulating layer and the second metal layer and covering the second metal layer;
    a first via hole and a second via hole penetrating the first insulating layer and the second insulating layer on the first metal layer;
    a third via hole penetrating the second insulating layer; and
    a third metal layer disposed on the second insulating layer and comprising a second data line and a second vertical scan line, wherein the second data line is connected in parallel with the first data line through the first via hole, the second vertical scan line is connected in parallel with the first vertical scan line through the second via hole, and the second vertical scan line is connected to the horizontal scan line through the third via hole;
    wherein the first via hole, the second via hole, and the third via hole are formed by a same manufacturing process.

2. The array substrate according to claim 1, further comprising a plurality of sub-pixel regions, wherein the first via hole and the second via hole are located between the sub-pixel regions, and the third via hole is located in one of the sub-pixel regions.

3. The array substrate according to claim 1, wherein the second metal layer further comprises a common electrode, and a gate electrode connected to the horizontal scan line.

4. The array substrate according to claim 3, further comprising an active layer disposed on the second insulating layer and corresponding to the gate electrode, wherein the third metal layer further comprises a source electrode and a drain electrode disposed on the active layer.

5. The array substrate according to claim 4, further comprising:
    a protective passivation layer disposed on the second insulating layer, the third metal layer, and the active layer and covering the third metal layer and the active layer;
    a color resist layer disposed on the protective passivation layer;
    an insulating flat layer disposed on the color resist layer;
    a fourth via hole penetrating the protective passivation layer, the color resist layer, and the insulating flat layer on the drain electrode; and a pixel electrode layer disposed on the insulating flat layer and connected to the drain electrode through the fourth via hole.

6. A method for fabricating an array substrate, comprising:

providing a substrate;

forming a first metal layer on the substrate, wherein the first metal layer comprises a first data line and a first vertical scan line formed on the substrate;

forming a first insulating layer on the substrate and the first metal layer, wherein the first insulating layer covers the first metal layer;

forming a second metal layer on the first insulating layer, wherein the second metal layer comprises a horizontal scan line formed on the first insulating layer;

forming a second insulating layer on the first insulating layer and the second metal layer, wherein the second insulating layer covers the second metal layer;

forming a first via hole and a second via hole penetrating the first insulating layer and the second insulating layer on the first metal layer;

forming a third via hole penetrating the second insulating layer, wherein the first via hole, the second via hole, and the third via hole are formed by a same manufacturing process; and forming a third metal layer on the second insulating layer, wherein the third metal layer comprises a second data line and a second vertical scan line formed on the second insulating layer, the second data line is connected in parallel with the first data line through the first via hole, the second vertical scan line is connected in parallel with the first vertical scan line through the second via hole, and the second vertical scan line is connected to the horizontal scan line through the third via hole.

7. The method for fabricating the array substrate according to claim 6, wherein the first via hole, the second via hole, and the third via hole are formed by a gray-scale mask.

8. The method for fabricating the array substrate according to claim 7, wherein the array substrate comprises a plurality of sub-pixel regions, the first via hole and the second via hole are formed between the sub-pixel regions, and the third via hole is formed in one of the sub-pixel regions.

9. The method for fabricating the array substrate according to claim 6, wherein the second metal layer further comprises a common electrode and a gate electrode formed on the first insulating layer, and the gate electrode is connected to the horizontal scan line.

10. The method for fabricating the array substrate according to claim 9, before the step of forming the first via hole and the second via hole penetrating the first insulating layer and the second insulating layer on the first metal layer and the step of forming the third via hole penetrating the second insulating layer, further comprising:

forming an active layer on the second insulating layer, wherein the active layer corresponds to the gate electrode, and the third metal layer further comprises a source electrode and a drain electrode formed on the active layer.

11. The method for fabricating the array substrate according to claim 10, further comprising:

forming a protective passivation layer on the second insulating layer, the third metal layer, and the active layer, wherein the protective passivation layer covers the third metal layer and the active layer;

forming a color resist layer on the protective passivation layer;

forming an insulating flat layer on the color resist layer;

forming a fourth via hole penetrating the protective passivation layer, the color resist layer, and the insulating flat layer on the drain electrode; and forming a pixel electrode layer on the insulating flat layer, wherein the pixel electrode layer is connected to the drain electrode through the fourth via hole.

12. A display panel, comprising a color filter substrate, an array substrate, and a liquid crystal layer disposed between the color filter substrate and the array substrate, wherein the array substrate comprises:

a substrate;

a first metal layer disposed on the substrate and comprising a first data line and a first vertical scan line;

a first insulating layer disposed on the substrate and the first metal layer and covering the first metal layer;

a second metal layer disposed on the first insulating layer and comprising a horizontal scan line;

a second insulating layer disposed on the first insulating layer and the second metal layer and covering the second metal layer;

a first via hole and a second via hole penetrating the first insulating layer and the second insulating layer on the first metal layer;

a third via hole penetrating the second insulating layer, wherein the first via hole, the second via hole, and the third via hole are formed by a same manufacturing process; and a third metal layer disposed on the second insulating layer and comprising a second data line and a second vertical scan line, wherein the second data line is connected in parallel with the first data line through the first via hole, the second vertical scan line is connected in parallel with the first vertical scan line through the second via hole, and the second vertical scan line is connected to the horizontal scan line through the third via hole.

13. The display panel according to claim 12, wherein the array substrate further comprises a plurality of sub-pixel regions, the first via hole and the second via hole are located between the sub-pixel regions, and the third via hole is located in one of the sub-pixel regions.

14. The display panel according to claim 12, wherein the second metal layer further comprises a common electrode, and a gate electrode connected to the horizontal scan line.

15. The display panel according to claim 14, wherein the array substrate further comprises an active layer disposed on the second insulating layer and corresponding to the gate electrode, and the third metal layer further comprises a source electrode and a drain electrode disposed on the active layer.

16. The display panel according to claim 15, wherein the array substrate further comprises:

a protective passivation layer disposed on the second insulating layer, the third metal layer, and the active layer and covering the third metal layer and the active layer;

a color resist layer disposed on the protective passivation layer;

an insulating flat layer disposed on the color resist layer;

a fourth via hole penetrating the protective passivation layer, the color resist layer, and the insulating flat layer on the drain electrode; and a pixel electrode layer disposed on the insulating flat layer and connected to the drain electrode through the fourth via hole.

\* \* \* \* \*